(12) United States Patent
Dore et al.

(10) Patent No.: US 6,291,267 B1
(45) Date of Patent: Sep. 18, 2001

(54) PROCESS FOR UNDERFILLING CHIP-UNDER-CHIP SEMICONDUCTOR MODULES

(75) Inventors: Kevin A. Dore, Fishkill; David L. Edwards, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/418,940

(22) Filed: Oct. 15, 1999

Related U.S. Application Data

(62) Division of application No. 09/328,962, filed on Jun. 9, 1999.

(51) Int. Cl.[7] .............................. H01L 21/44; H01L 21/48; H01L 21/58
(52) U.S. Cl. ...................... 438/108; 438/107; 438/109; 438/110; 438/126; 438/127; 438/118
(58) Field of Search .................................. 438/107, 108, 438/109, 110, 126, 127, 118

(56) References Cited

U.S. PATENT DOCUMENTS

| | | | |
|---|---|---|---|
| 4,326,214 | 4/1982 | Trueblood | 357/74 |
| 5,307,240 | 4/1994 | McMahon | 361/728 |
| 5,328,559 | * 7/1994 | Jerman | 156/647 |
| 5,383,269 | 1/1995 | Rathmell et al. | 29/830 |
| 5,616,958 | 4/1997 | Laine et al. | 257/717 |
| 5,760,478 | 6/1998 | Bozso et al. | 257/777 |
| 5,963,429 | * 10/1999 | Chen | 361/764 |
| 6,084,308 | * 7/2000 | Kelkar et al. | 257/777 |

* cited by examiner

*Primary Examiner*—John F. Niebling
*Assistant Examiner*—David A Zarneke
(74) *Attorney, Agent, or Firm*—Ratner & Prestia; Ira D. Blecker, Esq.

(57) ABSTRACT

A process for underfilling a chip-under-chip module. The module comprises a first larger chip, a second smaller chip attached to the underside of the first chip, a substrate having a top surface to which the first chip is mounted, a cavity into which the second chip fits when the first chip is mounted on the top surface, and an access channel connecting the cavity to the top surface. Underfill is disposed under the first chip between the first chip and the substrate, between the first and second chips, within the cavity, and within the access channel. The process for underfilling such a module comprises the steps of forming the substrate having the cavity and access channel in the substrate, connecting the first chip to the substrate, and dispensing underfill through the access channel.

19 Claims, 2 Drawing Sheets

PROCESS FOR UNDERFILLING CHIP-UNDER-CHIP SEMICONDUCTOR MODULES

This application is a divisional of U.S patent application Ser. No. 09/328,962, filed on Jun. 9, 1999, which is pending.

TECHNICAL FIELD

The present invention relates generally to semiconductor modules and, more specifically, to a structure and process for improved underfill of chips in semiconductor modules that have the circuit side of a larger chip connected via solder bumps to both the circuit side of a smaller chip and a substrate.

BACKGROUND OF THE INVENTION

Many semiconductor modules use Controlled Collapse Chip Connection (C4) solder balls or bumps to connect the circuitry side of the chip to the substrate. Chips using C4 technology are commonly referred to as either "C4 chips" or "flip chips." For flip chips designed to be wire bonded to a substrate, the C4 pattern is typically around the perimeter of the chip. For flip chips requiring greater numbers of interconnections, and that have been designed for C4 connections, a fully or partially populated array of C4 connections is used. In modules that are not hermetic, and that use C4 connections, an epoxy underfill is typically used. The underfill serves two purposes: (1) it provides environmental protection of the chip circuitry and the solder connections, and (2) it carries some of the shear loading between the chip and the carrier, thus extending the fatigue resistance of the C4 connections.

For example, FIG. 1 shows a conventional semiconductor module assembly 8 comprising flip chip 10. Flip chip 10 is mounted to substrate 14 using C4 solder balls 12. This mounting is usually accomplished by use of an automated placement tool. A thin layer of flux (not shown) is usually applied to either the top surface of substrate 14 or to solder balls 12. After placement of flip chip 10 on substrate 14, the assembly is typically run through a reflow furnace in which oxygen levels are controlled to very low levels. The C4 solder balls 12 are typically a lead-tin alloy, such as 97% lead and 3% tin or 37% lead and 63% tin (by weight). Substrate 14 is typically ceramic, but can be an organic substrate, or may comprise any substrate materials known in the art. Substrate 14 has input-output connections 18 such as Pin Grid Array (PGA), Ball Grid Array (BGA), Column Grid Array (CGA), or Land Grid Array (LGA) connections.

Although the array of C4 solder balls 12 is typically well-aligned to a corresponding array of solder-wettable pads (not shown) on the top surface of substrate 14 by the placement tool, the surface tension of the reflowed solder balls automatically re-aligns the two arrays during the solder reflow step. During cooling, C4 solder balls 12 solidify and rigidly attach flip chip 10 to substrate 14. Such attachment provides both a mechanical and an electrical connection between the flip chip 10 and the substrate 14.

Underfill 16 is typically applied to preheated module assembly 8 by an automated dispense tool (not shown). The module assembly 8 is typically preheated to effectively reduce the viscosity of underfill 16, thereby reducing the time required for and improving the effectiveness of the underfill process. Underfill 16 is typically applied along a single edge of flip chip 10 and then allowed to flow by capillary action to completely fill the spaces between flip chip 10 and substrate 14, thus surrounding C4 solder balls 12.

Depending on the size of flip chip 10 and the viscosity of underfill 16, a single dispense pass may be sufficient. Multiple passes may be required, however, with sufficient delay allowed between each pass to allow the underfill 16 to completely flow under the flip chip 10. Generally, the presence of a fillet 13 of underfill 16 around the complete perimeter of flip chip 10 indicates that enough underfill 16 has been applied. Then, the underfill 16 is cured by any of several mechanisms known in the art, such as exposure to heat, ultraviolet light, or microwave energy.

Although it is not uncommon for wirebond chips to be mounted in cavities, flip chips have typically been joined to substrates without a need for cavities. In a recent effort to bring the function of separate chips as close together as possible on a package, some modules have been designed with a large chip attached using C4 technology to both a substrate and to a smaller chip. Referring now to FIG. 2, there is shown a module assembly 19 comprising a larger chip 20 with a smaller chip 22 attached to the larger chip 20. The stacked chip structure 23 is joined to a substrate 14'.

The C4 solder balls 12 around the perimeter of larger chip 20 are attached to substrate 14'; the C4 solder balls 12' near the middle of the larger chip 20 are attached to smaller chip 22. Solder balls 12 and 12' may comprise the same alloy, or solder balls 12' between chips 20 and 22 may be of a higher melting temperature alloy than solder balls 12 between larger chip 20 and substrate 14' so that solder balls 12' do not reflow when larger chip 20 is joined to substrate 14'. To prevent interference between smaller chip 22 and substrate 14'; there is a shallow cavity 24 in the substrate 14' that can accommodate the smaller chip 22.

The configuration of stacked chip structure 23 within cavity 24 presents some difficulties, however, in providing underfill (not shown) by conventional underfill techniques. Although underfill applied along the edge of larger chip 20 flows under larger chip 20 and is drawn under and around the perimeter of larger chip 20 by capillary action, capillary action is insufficient to draw underfill into cavity 24 or into the space 25 between chips 20 and 22. Thus, although the underfill may fill the thin gaps 26 between larger chip 20 and substrate 14', it does not provide the desired coverage in cavity 24 or spaces 25. As a result, air trapped in those regions may compromise the integrity of module assembly 19 if the trapped air expands during subsequent heating steps typically used to cure the underfill.

U.S. Pat. No. 5,760,478 issued to Bozso et al. describes a system comprising two flip chips connected face-to-face by conventional solder connections, with one or both of the chips having a chip-to-substrate connection for power and signal. For instance, a low-power device, such as a Dynamic Random Access Memory (DRAM) chip, may be attached directly to a higher-power logic chip, with the logic chip also connected to a substrate. In the preferred embodiment, both the chip-to-chip connections and the chip-to-substrate connections are solder connections. The low-power chip is smaller than the higher-power chip and fits under the larger chip within a cavity in the substrate, as is shown in FIG. 2 by Bozso et al. This type of structure presents difficulties in providing underfill by conventional techniques, as described above. Thus, Thus, there is a need in the art for a process and module structure that enables underfill of such stacked chip structures while avoiding the problems of the prior art.

SUMMARY OF THE INVENTION

To meet this and other needs, and in view of its purposes, the present invention provides a chip-under-chip module comprising a first larger chip, a second smaller chip mounted under the first larger chip, a substrate having a top surface to which the first larger chip is mounted, such as with C4 solder balls, a cavity into which the second smaller chip fits when the first larger chip is mounted on the top surface, and an access channel connecting the cavity to the top surface. The module further comprises underfill, such as a heat-curable or radiation-curable resin, disposed under the first larger chip between the first larger chip and the substrate, between the first and second chips, within the cavity, and within the access channel. The module is preferably produced by a process of dispensing the underfill through the access channel.

The channel may have a constant depth within the substrate or may have a sloping depth from the top surface to the cavity. The channel may extend to an edge of the substrate, or may extend essentially the same distance from the first larger chip perimeter as a fillet of underfill between the first larger chip and the substrate. The substrate may further have a recess in which the first larger chip is disposed, and in which the channel comprises a portion of the recess.

The present invention also comprises a substrate for receiving such a module, the substrate having a surface, a cavity extending to the surface and dimensioned to receive the second smaller chip but not the first larger chip, and an access channel extending from the cavity. The access channel extends to an access point on the substrate surface located at a distance from the cavity such that, when the module is placed on the substrate with the second smaller chip contained in the cavity, the access point is not covered by the first larger chip. The substrate may comprise a ceramic substrate in which the cavity and the access channel are created before sintering the substrate. The substrate may also comprise an organic substrate in which the cavity and access channel are created after substrate fabrication.

The present invention also provides a process for underfilling chip-under-chip modules. The process comprises the steps of forming a substrate having a top surface and a cavity in the substrate; creating an access channel connecting to the cavity; connecting a first larger chip, having a second smaller chip connected to the first larger chip underneath the first larger chip, to the substrate top surface with the second smaller chip disposed within the cavity; and dispensing underfill through the access channel to flow into and fill between the first larger chip and the substrate, between the first and second chips, in the cavity, and in the channel. The underfill may be dispensed directly into the channel, at the end of the channel, or in a pool on the substrate top surface from which the underfill drains into the channel.

The channel may be created with a rotary cutter after substrate fabrication or, for ceramics, preferably before sintering the substrate. The module may be heated before or tilted during the underfill dispensing step to help assist the underfill flow. The process may further comprise curing the underfill, for example, by exposure to heat or to radiation, such as ultraviolet or microwave radiation, for a sufficient amount of time.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Figure 1:
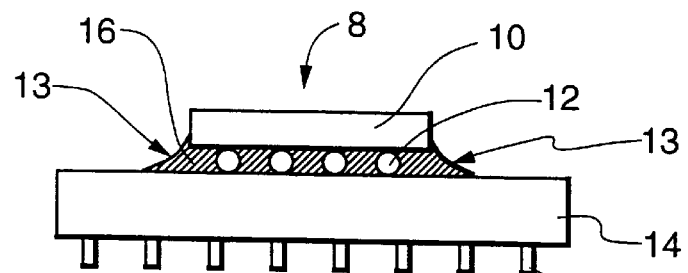
FIG. 1 is a schematic cross-sectional illustration of a flip chip module having underfill according to the prior art.
Figure 2:
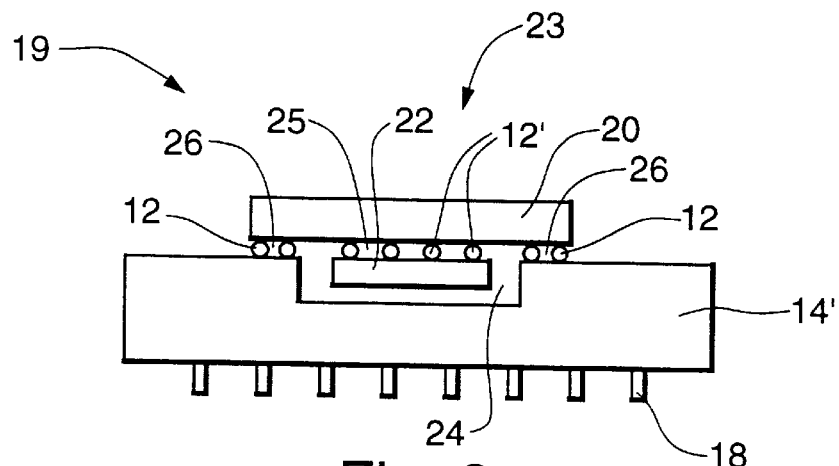
FIG. 2 is a schematic cross-sectional illustration of a stacked flip chip module with one chip mounted in a cavity in a substrate according to the prior art.
Figure 3:
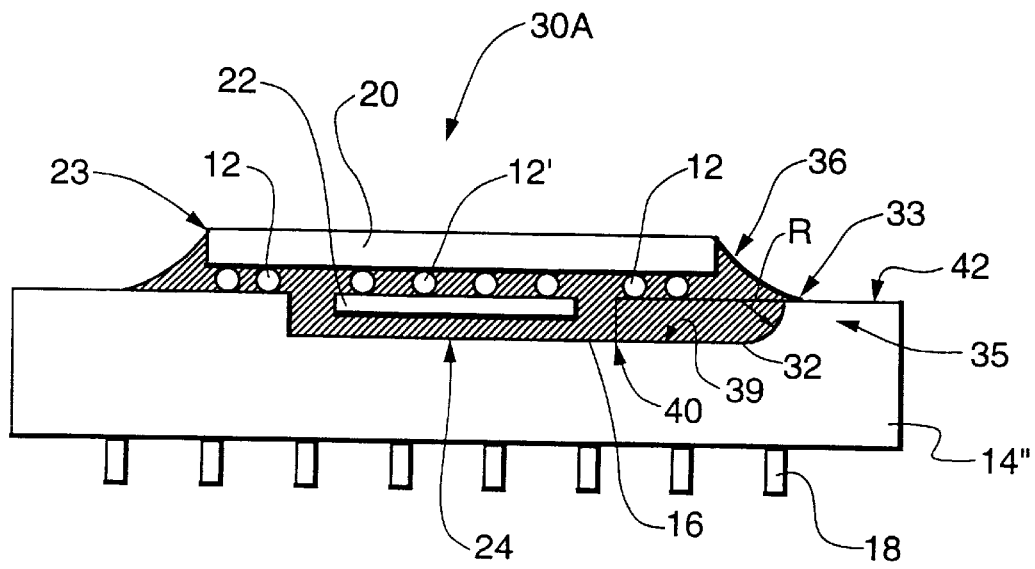
FIG. 3 is a schematic cross-sectional illustration of a chip-under-chip module having an access channel with a rounded end according to the present invention.
Figure 4:
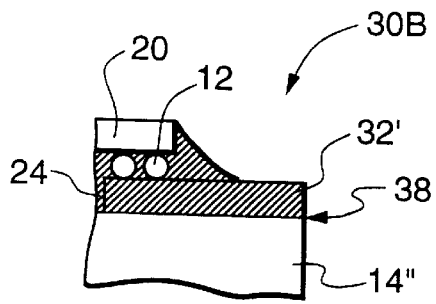
FIG. 4 is a portion of a schematic cross-sectional illustration of a chip-under-chip module having an access channel extending to an edge of the substrate.

Referring now to the drawing, wherein like reference numbers refer to like elements throughout, FIGS. 3 through 6 illustrate exemplary module assemblies of the present invention. Module assembly 30A, as shown in FIG. 3, comprises a stacked chip structure 23 consisting of a larger chip 20 and a smaller chip 22 connected by solder balls 12'. Larger chip 20 is connected by solder balls 12 to substrate 14" having a cavity 24 in which smaller chip 22 is disposed, all similar to the components shown in FIG. 2.

According to the present invention, however, substrate 14" as shown in FIG. 3, unlike substrate 14' of FIG. 2, further comprises an access channel 32 connecting to cavity 24 and exiting outwardly from under smaller chip 20 to outside the chip perimeter. Channel 32 is preferably an open-top trench as is shown in FIG. 3.

In one embodiment, access channel 32 is a trench of constant depth terminating at an access point 33 with a curved end wall 35 having radius R connecting channel floor 39 to substrate top surface 42, as shown in FIG. 3. The depth of access channel 32 is the same as the depth of cavity 24 at interface 40 where the channel 32 and cavity 24 intersect. Access channel 32 has a width W1, shown in FIG. 7, that is typically between about 0.5 and about 3 mm wide, most preferably 1 mm wide.

As shown in FIG. 3, access channel 32 extends essentially the same distance or slightly farther from larger chip 20 as does fillet 36 of underfill 16 between larger chip 20 and top surface 42 of substrate 14". In the alternative, access channel 32 may extend well beyond the edge of fillet 36. In one alternate embodiment shown in FIG. 4, access channel 32' of module 30B may extend from cavity 24 to an edge 38 of substrate 14".

Figure 5:
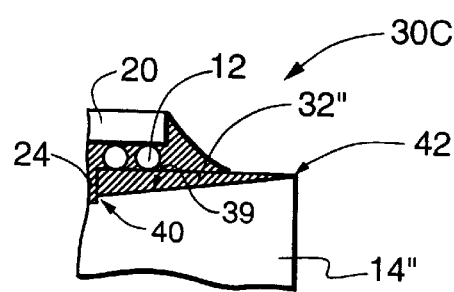
FIG. 5 is a portion of a schematic cross-sectional illustration of a chip-under-chip module having a sloped access channel.

In another alternate embodiment shown in FIG. 5, access channel 32" of module 30C may be angled with respect to top surface 42 of substrate 14". In particular, access channel 32" may be an open-top trench having a floor 39 that slopes with increasing depth from top surface 42 of substrate 14" outside the perimeter of larger chip 20 to a maximum depth where the trench connects to cavity 24. Also, as shown in FIG. 5, the depth of access channel 32" at interface 40 where the channel 32" intersects cavity 24 may have a different depth than cavity 24.

Figure 7:
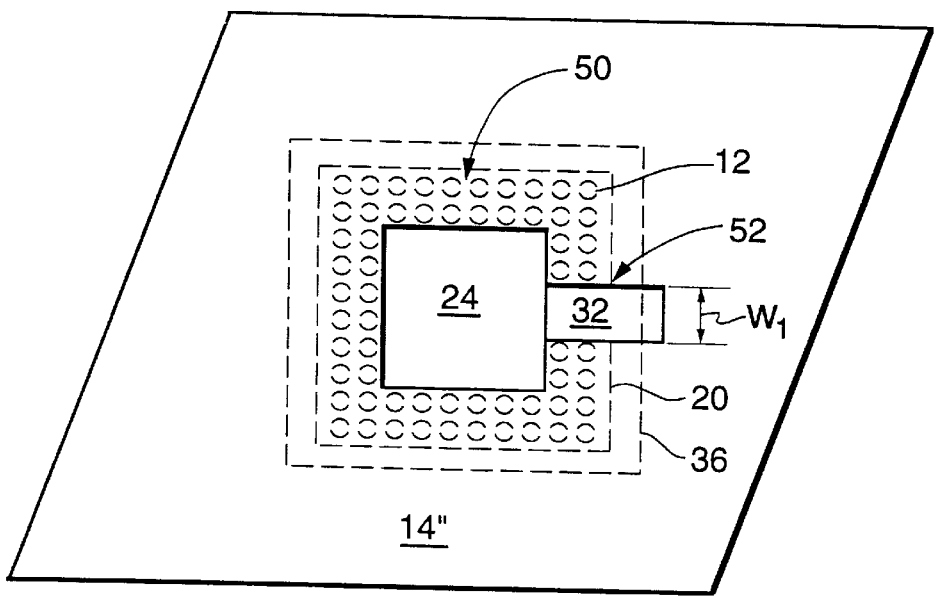
FIG. 7 is a schematic illustration of a plan view of a substrate prepared according to the present invention to receive a chip-under-chip module.

In one embodiment, substrate 14" is ceramic, such as glass ceramic, or Multi-Layer Ceramic (MLC), for example 9211 MLC. Although access channel 32" may be cut into the substrate 14" after sintering the substrate 14", cutting the access channel 32" may be easier before sintering. Referring now to FIG. 7, there is shown substrate 14" with prospective locations of larger chip 20, C4 cage 50 (the layout of C4 solder balls 12 that connect to the periphery of larger chip 20), and fillet 36 depicted in dashed lines. Cavity 24 may be formed by conventional techniques in substrate 14" where the substrate design has a sacrificial path 52 through C4 cage 50. Sacrificial path 52 defines a portion of C4 cage 50 where no connections are positioned. Thus, access channel 32 is cut through sacrificial path 52 just before sintering and, as shown in FIG. 7, extends beyond the prospective periphery of larger chip 20 essentially to or just beyond the edge of fillet 36.

Access channel 32 may be cut with a rotary cutter (not shown) with the axis of rotation of the cutter parallel to and above the top surface 42 of substrate 14". The cutter may have a radius the same dimension as radius R. In another embodiment, the rotary cutter may be positioned with the axis of rotation perpendicular to the top surface 42 of substrate 14". In yet another embodiment, in which substrate 14" comprises a multi-layer laminated substrate, the shape of the access channel 32 may be punched, stamped, or otherwise fabricated as known in the art into the individual layers of substrate 14" before the layers are stacked, laminated, and sintered.

Figure 6:
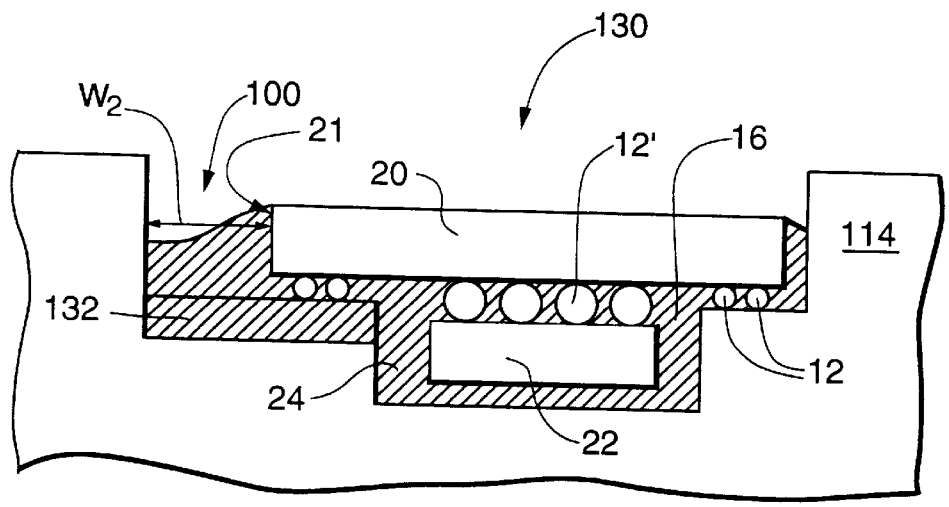
FIG. 6 is a schematic cross-sectional illustration of a chip-under-chip module having a recess in the substrate into which the first chip is mounted.

In another embodiment, shown in FIG. 6, module assembly 130 may have both larger chip 20 and smaller chip 22 mounted within a recess 100 within the substrate 114. In such case, channel 132 is located within recess 100. At least a portion of recess 100 is wider than the perimeter of larger chip 20 by a sufficient amount W2 to enable underfill 16 to be dispensed in recess 100 into access channel 132, through which the underfill 16 flows under and between chips 20 and 22. The sufficiently wider portion of recess 100 may extend along the entire side 21 of larger chip 20 as shown in FIG. 6, or may extend only as far as the width of channel 132.

After stacked chip structure 23 is attached to substrate 14" or 114 and tested, the module assembly 30A, 30B, 30C, or 130 may be underfilled by dispensing underfill 16 into access channel 32, 32', 32", or 132 as shown in any of FIGS. 3 through 6. Capillary action will then draw underfill 16 under and between both chips 20 and 22. To decrease cycle time, the module assembly 30A, 30B, 30C, or 130 may be heated before dispensing the underfill, to reduce underfill viscosity. Underfill 16 may be dispensed manually or by an automated dispense tool. During the underfill step, the module assembly 30A, 30B, 30C, or 130 may remain in a horizontal position, or may be tilted during the underfill step so that gravity can aid the flow of underfill under the chips 20 and 22.

Underfill 16 may be dispensed directly in access channel 32 by placing a manual or automated dispense tool in channel 32 away from larger chip 20. Instead, underfill 16 may be dispensed indirectly at the outside end of access channel 32 and allowed to flow down inside the channel 32, or even dispensed on top surface 42 near the end of the channel 32 in a pool of underfill 16 that drains through channel 32 to underfill larger chip 20.

Underfill 16 may be a type that is cured by a heating cycle that exposes the module assembly 30A, 30B, 30C, or 130 to a predetermined cycle of time at an elevated temperature (about 150° C. to about 200° C., for example). Examples are the underfill EPX used by International Business Machines Corporation, or underfills manufactured by Dexter or Johnson-Mathey. Other types of underfill may also be used, however, including those specially engineered to be cured by exposure to radiation, such as ultraviolet or microwave radiation.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for underfilling chip-under-chip modules, the process comprising the steps of:

a) forming a substrate having a top surface and a cavity;

b) creating an access channel connecting to said cavity;

c) connecting a larger first chip having an underside, with a smaller second chip connected to the underside of the first chip, to said substrate top surface with said second chip disposed within said cavity; and d) dispensing underfill through said access channel to flow into and fill under said first chip in said cavity, between said first chip and said substrate, between said first and second chip, and in said channel.

2. The process of claim 1 comprising in step (d) dispensing the underfill through said channel.

3. The process of claim 1 comprising in step (d) dispensing the underfill at the end of said channel.

4. The process of claim 1 comprising in step (d) dispensing the underfill in a pool on said substrate top surface from which said underfill drains into said channel.

5. The process of claim 1 comprising in step (b) creating said channel with a rotary cutter.

6. The process of claim 5 comprising in step (b) creating said channel with a rotary cutter having a rotational axis parallel to said substrate top surface.

7. The process of claim 5 comprising in step (b) creating said channel with a rotary cutter having a rotational axis perpendicular to said substrate top surface.

8. The process of claim 1 comprising between step (a) and step (b), a step of sintering the substrate.

9. The process of claim 1 comprising between step (b) and step (c), a step of sintering the substrate.

10. The process of claim 1 comprising before step (d), heating said module.

11. The process of claim 1 comprising in step (d), tilting said module during dispensing said underfill to provide gravitational assistance to said fill flow.

12. The process of claim 1 further comprising the step (e) of curing said underfill.

13. The process of claim 12 wherein step (e) comprises curing said underfill by exposure to one of heat and radiation for a sufficient amount of time to effect curing.

14. The process of claim 13 wherein step (e) comprises curing said underfill by a heat-curing step conducted between about 150° C. and about 200° C.

15. The process of claim 13 wherein step (e) comprises curing said underfill with ultraviolet radiation.

16. The process of claim 13 wherein step (e) comprises curing said underfill with microwave radiation.

17. The process of claim 1 wherein step (c) comprises soldering said first chip to said substrate with controlled collapse chip connections.

18. The process of claim 1 wherein the substrate comprises a multi-layer substrate having a plurality of individual layers and wherein steps (a) and (b) comprise creating said cavity and said access channel in one or more individual layers and then assembling said individual layers together to create said multi-layer substrate.

19. The process of claim 18 wherein said cavity and said access channel are created in said individual layers by one of punching and stamping.

* * * * *